US012787549B2

(12) United States Patent
Abe et al.

(10) Patent No.: US 12,787,549 B2
(45) Date of Patent: Nov. 3, 2026

(54) DISPLAY DEVICE THAT SUPPRESSES LEAKED DISPLAY LIGHT ON IMAGE CAPTURE UNIT

(71) Applicant: SHARP KABUSHIKI KAISHA, Sakai City (JP)

(72) Inventors: Kaoru Abe, Sakai City (JP); Seiichi Mitsui, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 735 days.

(21) Appl. No.: 17/781,517

(22) PCT Filed: Dec. 17, 2019

(86) PCT No.: PCT/JP2019/049416

§ 371 (c)(1),
(2) Date: Jun. 1, 2022

(87) PCT Pub. No.: WO2021/124449

PCT Pub. Date: Jun. 24, 2021

(65) Prior Publication Data

US 2023/0006010 A1 Jan. 5, 2023

(51) Int. Cl.

| | |
|---|---|
| ***H10K 59/122*** | (2023.01) |
| ***H10K 50/844*** | (2023.01) |
| ***H10K 59/80*** | (2023.01) |
| *H10K 59/65* | (2023.01) |

(52) U.S. Cl.

CPC ....... *H10K 59/122* (2023.02); *H10K 59/8792* (2023.02); *H10K 50/844* (2023.02); *H10K 59/65* (2023.02); *H10K 59/873* (2023.02)

(58) Field of Classification Search

CPC ... H10K 59/65; H10K 59/8792; H10K 59/122
See application file for complete search history.

(56) References Cited

U.S. PATENT DOCUMENTS

| | | | | |
|---|---|---|---|---|
| 2011/0102308 | A1 | 5/2011 | Nakamura et al. | |
| 2013/0293459 | A1 | 11/2013 | Nakamura et al. | |
| 2018/0033848 | A1* | 2/2018 | Jung .................... | H10K 59/126 |

(Continued)

FOREIGN PATENT DOCUMENTS

| | | |
|---|---|---|
| JP | 2011-118330 A | 6/2011 |
| JP | 2019-035950 A | 3/2019 |

*Primary Examiner* — Norman D Richards
(74) *Attorney, Agent, or Firm* — ScienBiziP, P.C.

(57) ABSTRACT

A display device includes: a base substrate; a thin film transistor layer provided on the base substrate; a light-emitting element layer provided on the thin film transistor layer including a plurality of first electrodes, a common edge cover, a plurality of function layers, and a common second electrode layered in this order; a sealing film provided on the light-emitting element layer; a second display region provided inside a first display region surrounded by the first display region; and an image capture unit provided in the second display region on an opposite side to the thin film transistor layer of the base substrate, wherein a light blocking portion is provided in the second display region at a boundary with the first display region. The light blocking portion is provided in the edge cover, and the edge cover, in the second display region, includes a black colored portion colored black.

22 Claims, 10 Drawing Sheets

(56) References Cited

U.S. PATENT DOCUMENTS

| | | | | |
|---|---|---|---|---|
| 2019/0051859 | A1 | 2/2019 | Choi et al. | |
| 2020/0194721 | A1* | 6/2020 | Lee | H10K 59/65 |
| 2020/0251538 | A1* | 8/2020 | Zhang | H10K 59/12 |
| 2021/0091151 | A1* | 3/2021 | Lee | H10K 59/122 |
| 2021/0143365 | A1* | 5/2021 | Jo | H10K 59/122 |

* cited by examiner

DISPLAY DEVICE THAT SUPPRESSES LEAKED DISPLAY LIGHT ON IMAGE CAPTURE UNIT

TECHNICAL FIELD

The disclosure relates to a display device.

SUMMARY

Background Art

In recent years, a self-luminous type organic electroluminescence (hereinafter also referred to as EL) display device using an organic EL element has attracted attention as a display device that can replace liquid crystal display devices. For this organic EL display device, there has been proposed a structure in which in order to install an electronic component such as a camera or a fingerprint sensor, for example, a non-display region having an island shape is provided inside a display region in which an image is displayed and a through hole penetrating in the thickness direction is provided in the non-display region.

For example, PTL 1 discloses an electronic device including a display panel in which a module hole penetrating through a front face and a back face of a base substrate is provided in a display region, and an electronic module housed in the module hole.

CITATION LIST

Patent Literature

PTL 1: JP 2019-35950 A

SUMMARY

Technical Problem

In a known structure for an organic EL display device provided with an image capture unit such as a camera, the image capture unit is installed on the back side of the display panel, and the image capture unit captures an image on the front side of the display panel through the display panel. However, in an organic EL display device having such a structure, leaked light of the display light emitted at the display region is incident on the image capture unit from the periphery of the image capture unit, and thus light noise may be included in the image captured by the image capture unit.

The disclosure has been made in view of the above, and an object of the disclosure is to suppress leaked light of display light being incident on an image capture unit.

Solution to Problem

To achieve the object described above, a display device according to the disclosure includes a base substrate; a thin film transistor layer provided on the base substrate; a light-emitting element layer provided on the thin film transistor layer including a plurality of first electrodes, a common edge cover, a plurality of function layers, and a common second electrode layered in this order corresponding to a plurality of subpixels forming a first display region; a sealing film provided on the light-emitting element layer; a second display region provided inside the first display region surrounded by the first display region; and an image capture unit provided in the second display region on an opposite side to the thin film transistor layer of the base substrate, wherein a light blocking portion is provided in the second display region at a boundary with the first display region.

Advantageous Effects of Disclosure

According to the disclosure, the light blocking portion is provided at the boundary with the first display region in the second display region provided with the image capture unit inside the first display region, and thus the incident leaked light of the display light can be suppressed from entering the image capture unit.

DESCRIPTION OF EMBODIMENTS

Embodiments of the disclosure will be described below in detail with reference to the drawings. Note that the disclosure is not limited to each embodiment to be described below.

First Embodiment

Figure 1:
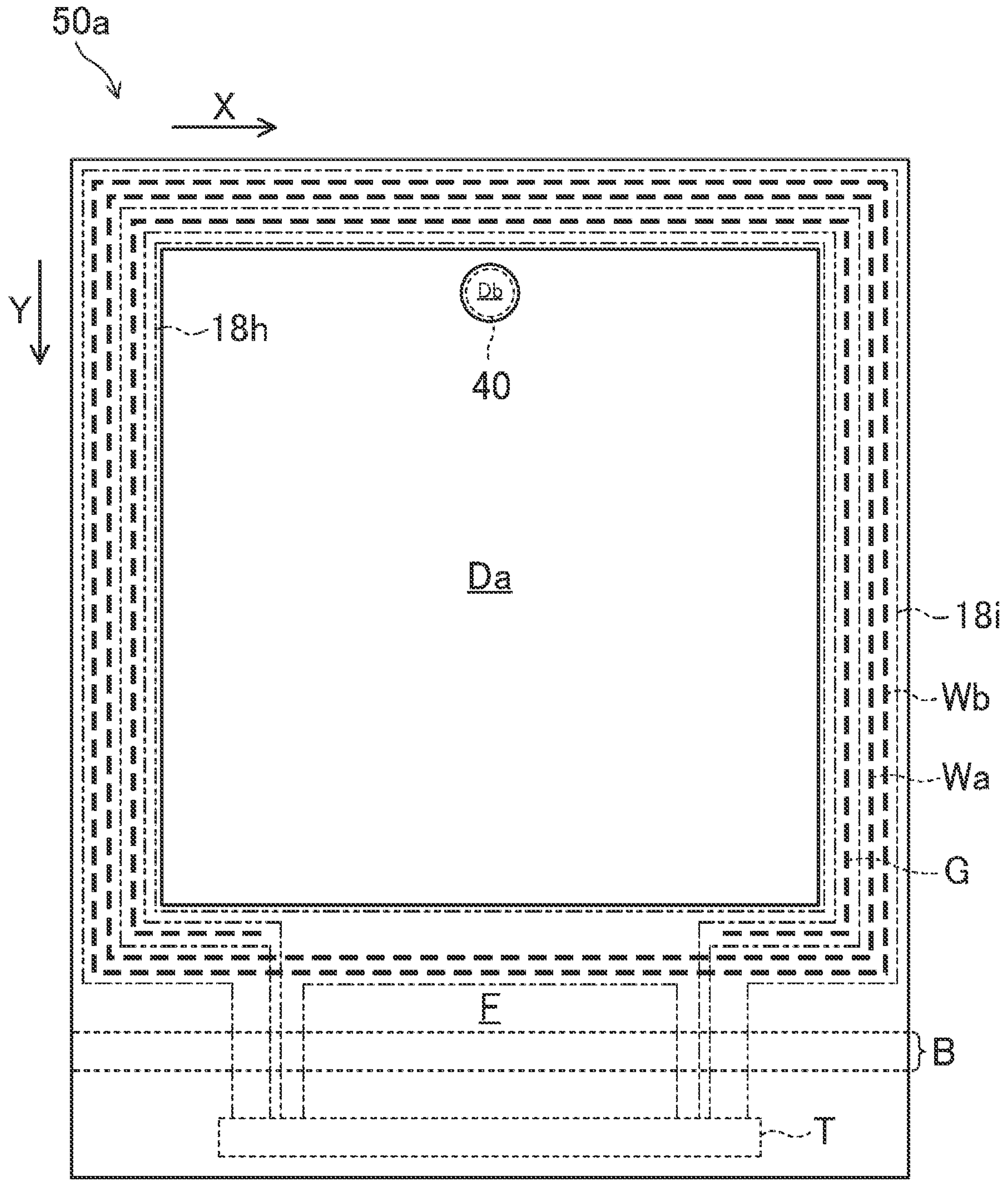
FIG. 1 is a plan view illustrating a schematic configuration of an organic EL display device according to a first embodiment of the disclosure.
Figure 2:
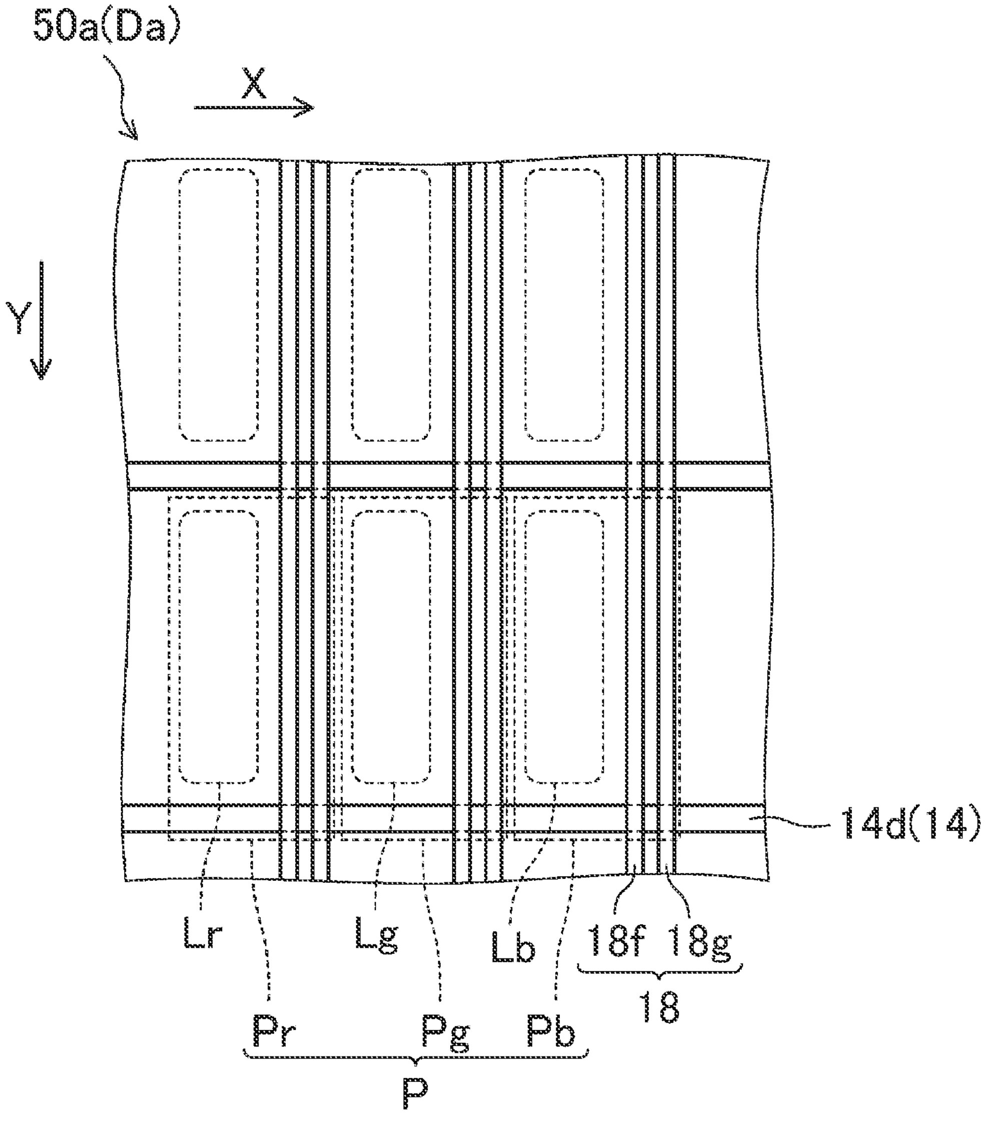
FIG. 2 is a plan view of a first display region of the organic EL display device according to the first embodiment of the disclosure.
Figure 3:
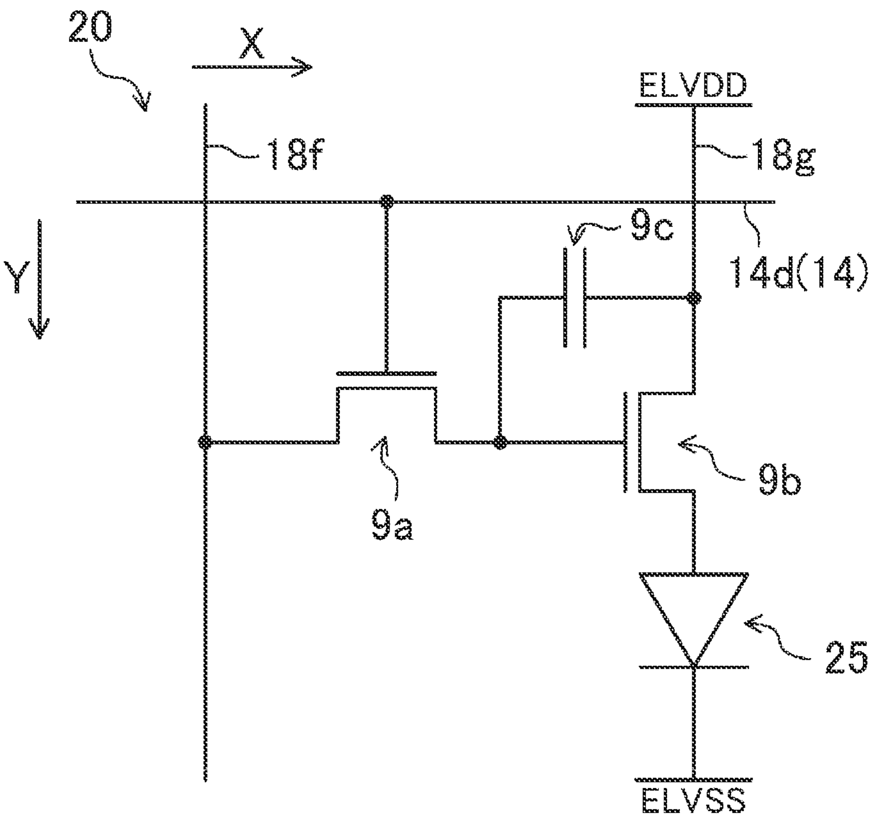
FIG. 3 is an equivalent circuit diagram of a thin film transistor layer configuring the organic EL display device according to the first embodiment of the disclosure.
Figure 4:
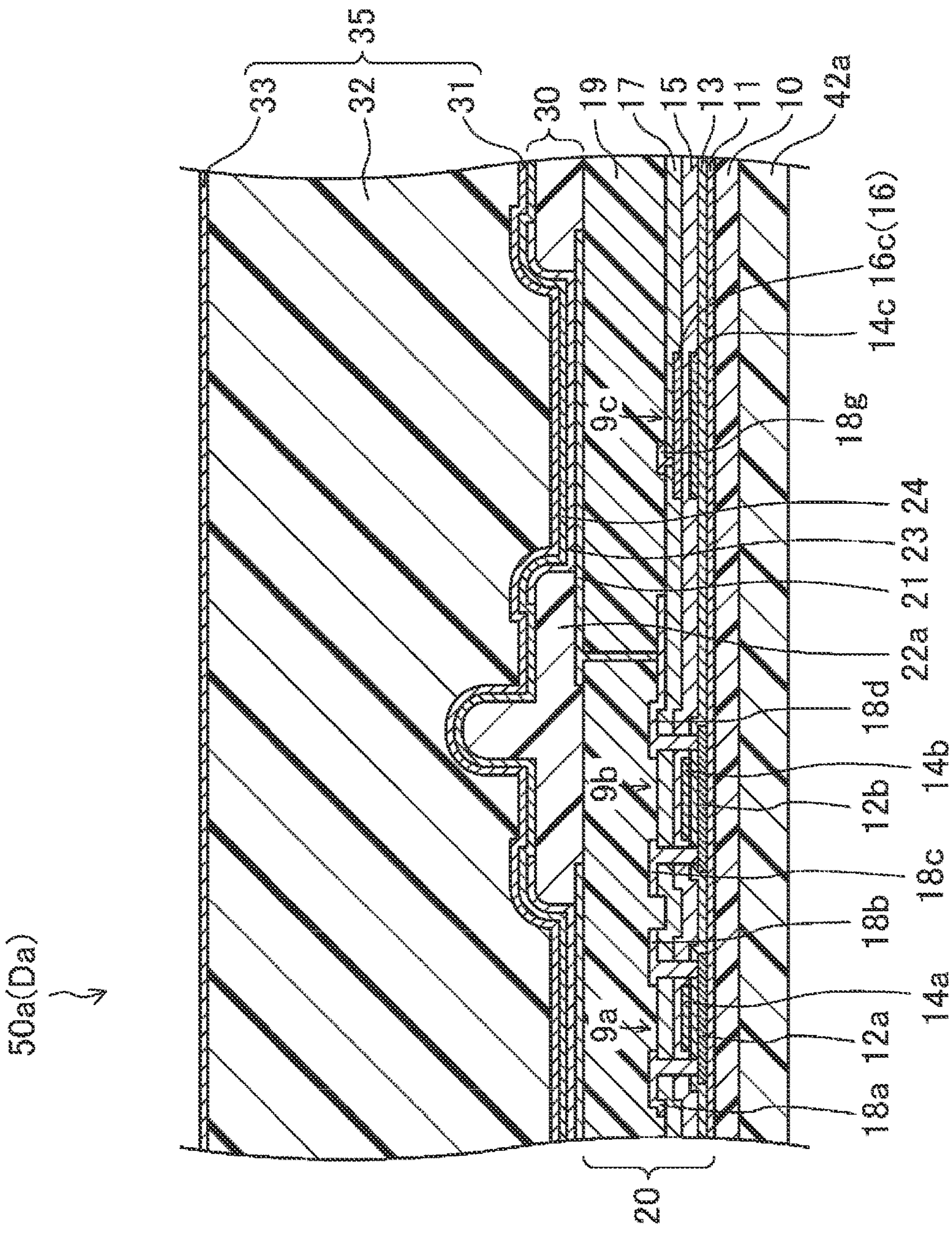
FIG. 4 is a cross-sectional view illustrating, in detail, the configuration of the first display region of the organic EL display device according to the first embodiment of thedisclosure.
Figure 5:
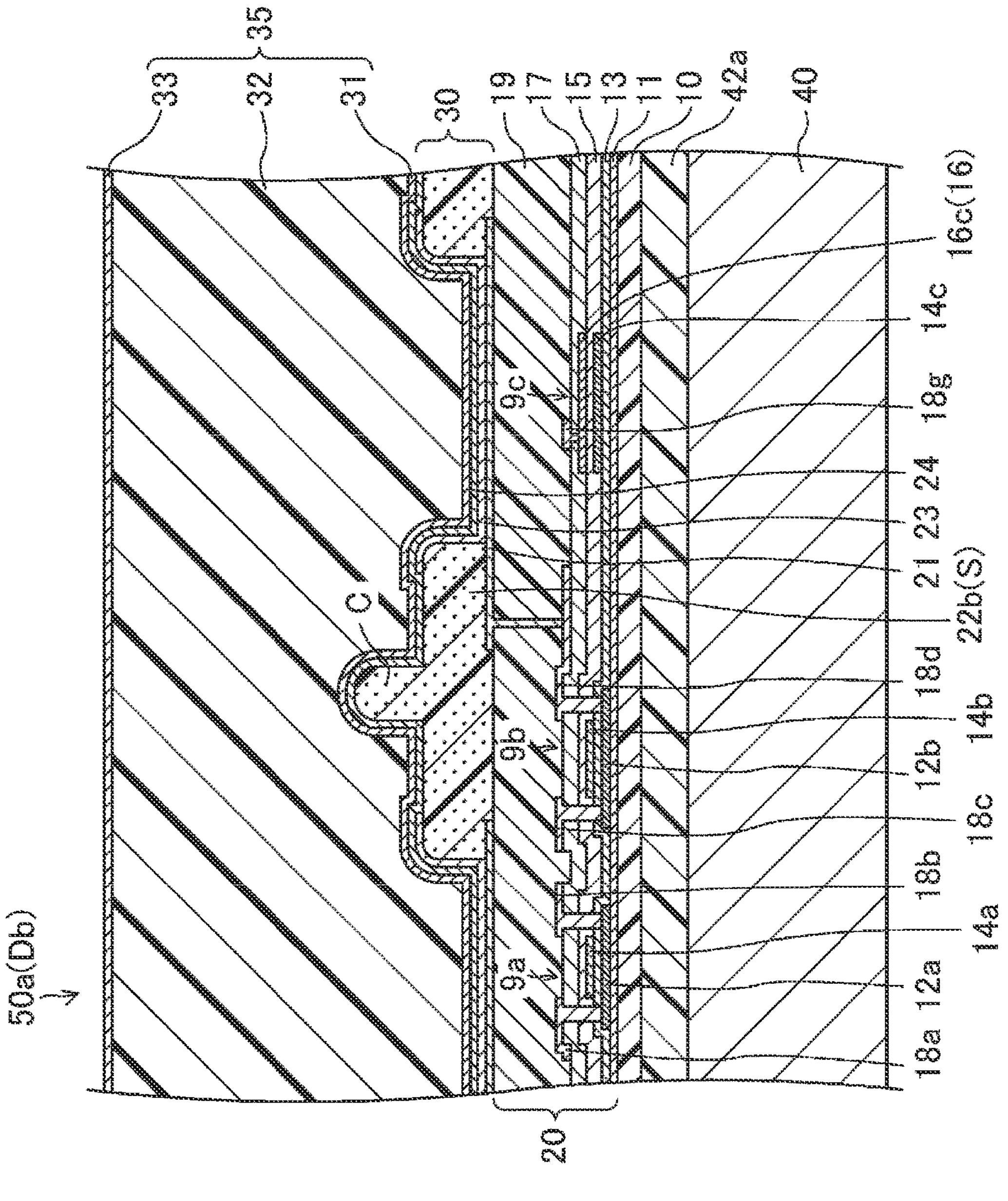
FIG. 5 is a cross-sectional view illustrating, in detail, the configuration of a second display region of the organic EL display device according to the first embodiment of thedisclosure.
Figure 6:
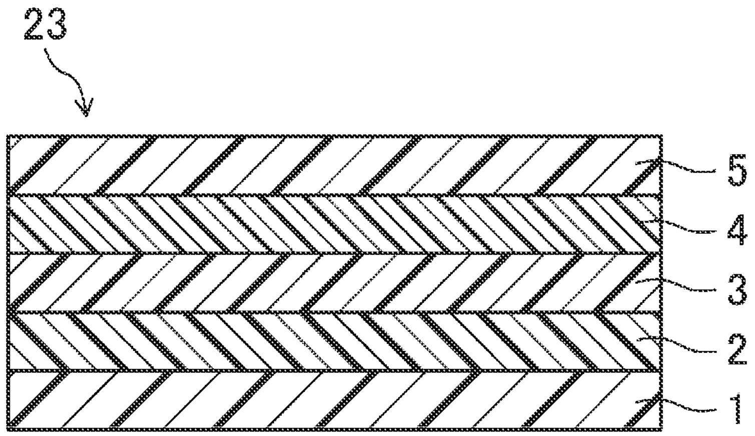
FIG. 6 is a cross-sectional view of an organic EL layer configuring the organic EL display device according to the first embodiment of the disclosure.
Figure 7:
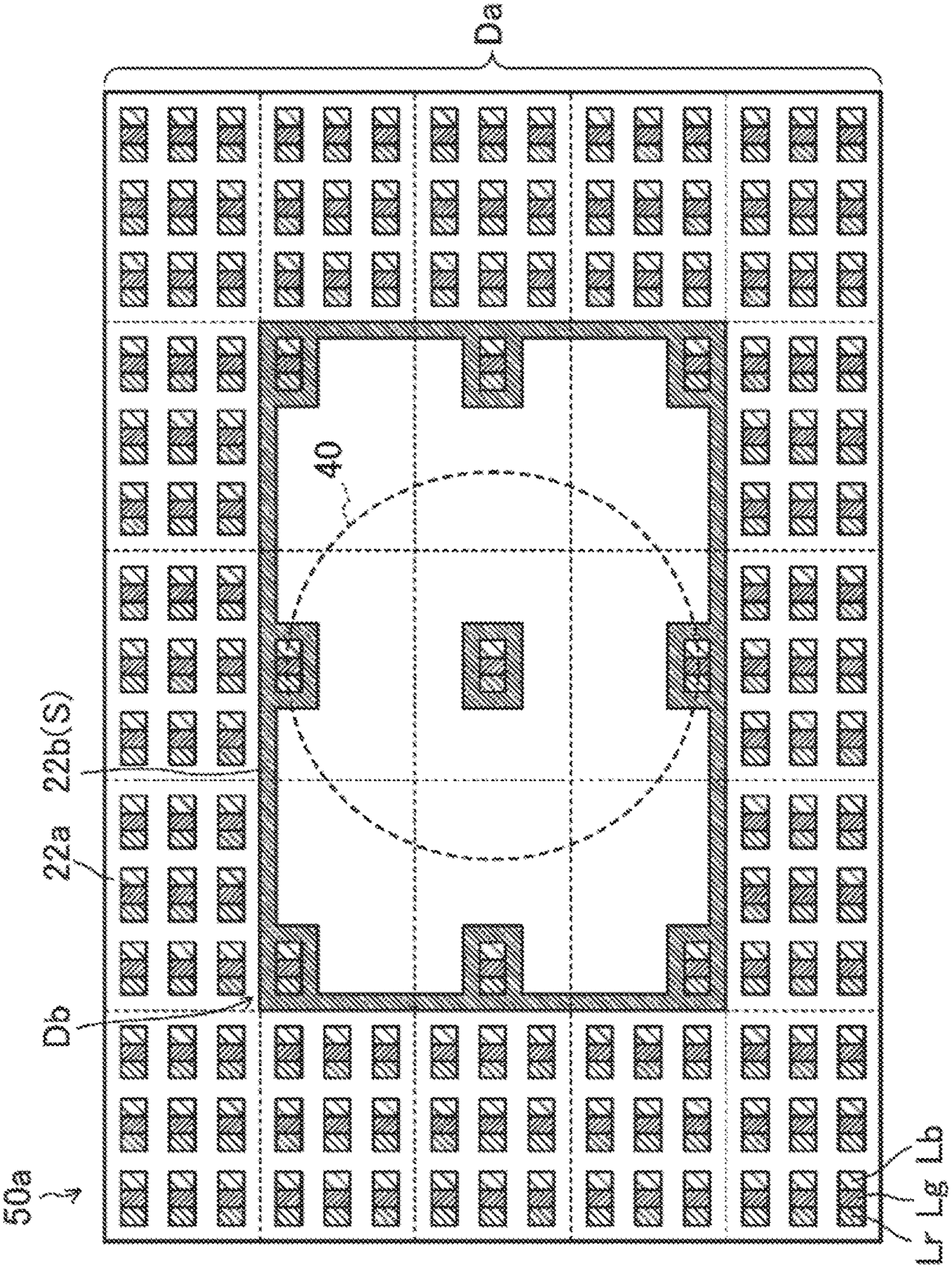
FIG. 7 is a plan view schematically illustrating the second display region of the organic EL display device according to the first embodiment of the disclosure and the periphery of the second display region.
Figure 8:
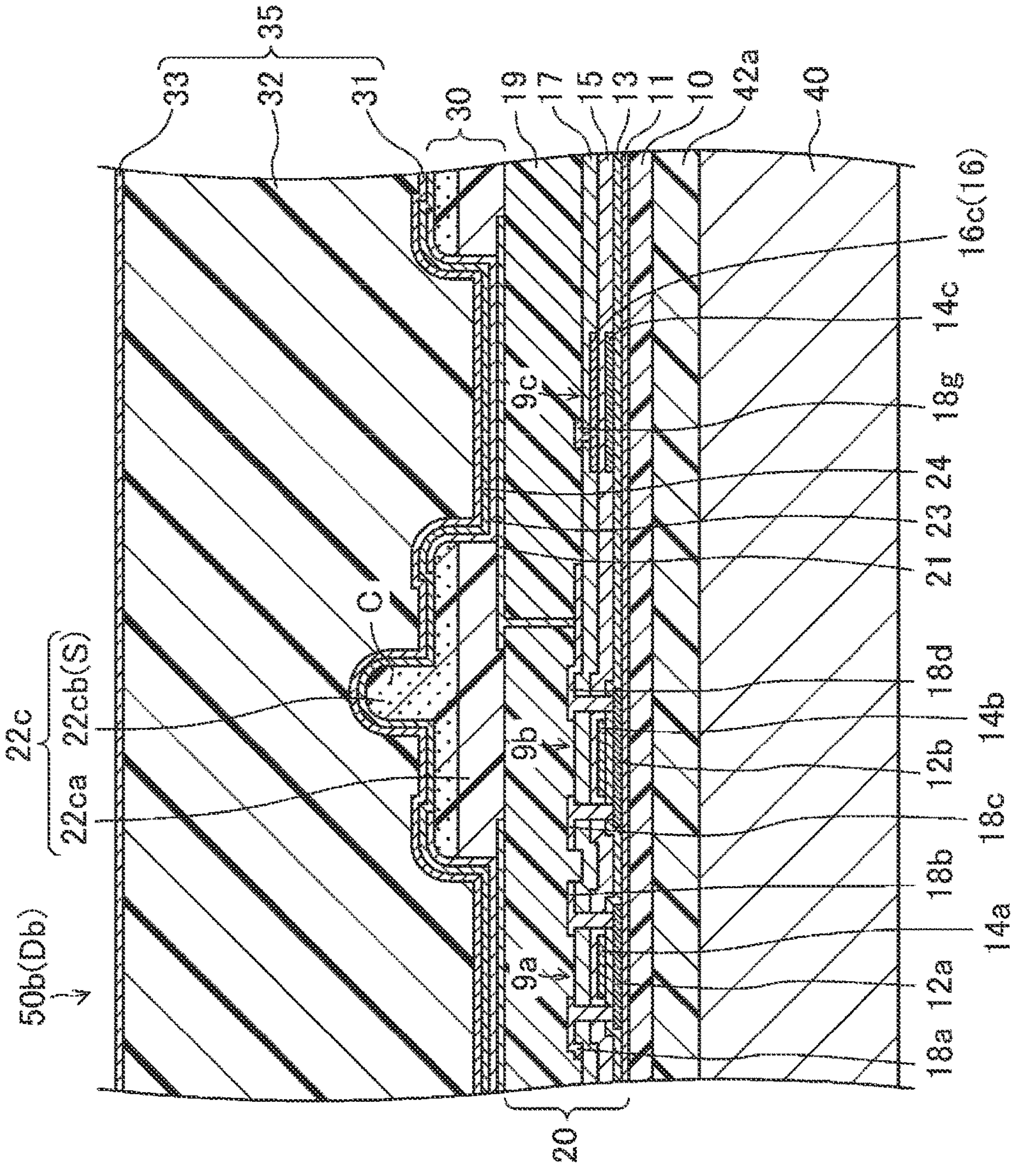
FIG. 8 is a cross-sectional view illustrating, in detail, the configuration of a second display region according to a modified example of the organic EL display device according to the first embodiment of the disclosure.

FIG. 1 to FIG. 8 illustrate a first embodiment of a display device according to thedisclosure. Note that, in each of the following embodiments, an organic EL display device including an organic EL element will be exemplified as a display device including a light-emitting element. Here, FIG. 1 is a plan view illustrating a schematic configuration of an organic EL display device 50*a* according to the present embodiment. Further, FIG. 2 is a plan view of a first display region Da of the organic EL display device 50*a*. FIG. 3 is an equivalent circuit diagram of a thin film transistor layer 20 constituting the organic EL display device 50*a*. FIGS. 4 and 5 are cross-sectional views illustrating, in detail, a configuration of the first display region Da and a second display region Db in the organic EL display device 50*a*. Further, FIG. 6 is a cross-sectional view illustrating an organic EL layer 23 configuring the organic EL display device 50*a*. Further, FIG. 7 is a plan view that schematically illustrates the second display region Db and a periphery of the second display region Db of the organic EL display device 50*a*. FIG. 8 is a cross-sectional view illustrating, in detail, a configuration of the second display region Db in the organic EL display device 50*b* according to a modified example of the organic EL display device 50*a*.

As illustrated in FIG. 1, the organic EL display device 50*a* includes, for example, the first display region Da provided in a rectangular shape and configured to display an image and a second display region Db provided inside the first display region Da and surrounded by the first display region Da and configured to display an image, and the frame region F provided in a frame-like shape surrounding the first display region Da. Note that in the present embodiment, the first display region Da having the rectangular shape has been exemplified, but examples of the rectangular shape include a substantially rectangular shape such as a shape whose sides are arc-shaped, a shape whose corners are arc-shaped, a shape in which a part of a side has a notch and the like. Additionally, in the present embodiment, the second display region Db having a circular shape has been exemplified, but the second display region Db may be another shape such as an oval or a polygon. Additionally, in the present embodiment, a configuration is exemplified in which one second display region Db is provided inside the first display region Da, but a plurality of the second display regions Db may be provided inside the first display region Da.

As illustrated in FIG. 2, a plurality of subpixels Pr, Pg, and Ph are arranged in a matrix shape in the first display region Da (and the second display region Db). In addition, in the first display region Da (and the second display region Db), for example, a subpixel Pr including a red light-emitting region Lr for displaying a red color, a subpixel Pg including a green light-emitting region Lg for displaying a green color, and a subpixel Pb including a blue light-emitting region Lb for displaying a blue color are provided adjacent to one another, as illustrated in FIG. 2. Note that, as illustrated in FIG. 2, three adjacent subpixels Pr, Pg, and Pb form one pixel P in the first display region Da (and the second display region Db). In addition, as illustrated in FIGS. 1 and 5, for example, an image capture unit 40 such as a complementary metal oxide semiconductor (CMOS) camera, a charge coupled device (CCD) camera, or the like is provided on the back surface side of the second display region Db, that is, on the side opposite the thin film transistor layer 20 described below of a resin substrate layer 10 described below. That is, the image capture unit 40 is disposed on the side opposite to the display surface of the organic EL display device 50*a* as the display panel. Here, as illustrated in FIG. 7, the pixel density of the second display region Db in which the image capture unit 40 is installed is less than the pixel density in the surrounding first display region Da. Thus, in the second display region Db, the light transmittance is high, and it is possible to take an image on the front side (the display surface side described above) of the display panel through the display panel.

A terminal portion T is provided in a lower end portion of the frame region F in FIG. 1 in such a manner as to extend in one direction (X-direction in the drawings). Additionally, as illustrated in FIG. 1, in the frame region F, a bending portion B bendable, for example, by 180 degrees (in a U-shape) about a bending axis that is the X-direction in the drawings is provided between the display region D and the terminal portion T and extends in one direction (X-direction in the drawings). Additionally, in the frame region F, as illustrated in FIG. 1, in a flattening film 19 described later, a substantially C shaped trench Gina plan view is provided in a state of extending through the flattening film 19. Here, as illustrated in FIG. 1, the trench G is provided in a substantially C shape and the terminal portion T side opens in a plan view.

As illustrated in FIGS. 4 and 5, the organic EL display device 50*a* includes a resin substrate layer 10 provided as a base substrate, a thin film transistor (hereinafter, also referred to as a TFT) layer 20 provided on the resin substrate layer 10, an organic EL element layer 30 provided as a light-emitting element layer on the TFT layer 20, and a sealing film 35 provided on the organic EL element layer 30.

The resin substrate layer 10 is formed, for example, of a polyimide resin or the like.

As illustrated in FIGS. 4 and 5, the TFT layer 20 includes a base coat film 11, semiconductor layers 12*a* and 12*b*, a gate insulating film 13, a first wiring line layer (14), a first interlayer insulating film 15, a second wiring line layer 16, a second interlayer insulating film 17, a third wiring line layer (18), and the flattening film 19 sequentially disposed on the resin substrate layer 10. Also, as illustrated in FIGS. 4 and 5, the TFT layer 20 includes a plurality of first TFTs 9*a*, a plurality of second TFTs 9*b*, and a plurality of capacitors 9*c* provided between the base coat film 11 and the flattening film 19. Here, as illustrated in FIGS. 2 and 3, in the TFT layer 20, a plurality of gate lines 14*d* are provided as the first wiring line layer 14 to extend parallel to each other in the X-direction in the drawings. In the TFT layer 20, as illustrated in FIG. 2 and FIG. 3, a plurality of source lines 18*f* are provided as the third wiring line layer 18 in such a manner as to extend parallel to each other in the Y-direction in the drawings. Also, in the TFT layer 20, as illustrated in FIG. 2 and FIG. 3, a plurality of power source lines 18*g* are provided as the third wiring line layer 18 in such a manner as to extend parallel to each other in the Y-direction in the drawings. Note that, as illustrated in FIG. 2, each of the power source lines 18*g* is provided so as to be adjacent to each of the source lines 18*f*. In the TFT layer 20, as illustrated in FIG. 3, each subpixel Pr, Pg, and Pb includes the first TFT 9*a*, the second TFT 9*b*, and the capacitor 9*c*.

The base coat film 11 is formed of a single-layer film or a layered film of an inorganic insulating film made of, for example, silicon nitride, silicon oxide, silicon oxynitride, or the like.

The first TFT 9*a* is electrically connected to the corresponding gate line 14*d* and source line 18*f* in each of the subpixels Pr, Pg, and Pb, as illustrated in FIG. 3. Further, as illustrated in FIGS. 4 and 5, the first TFT 9*a* includes a semiconductor layer 12*a*, a gate insulating film 13, a gate electrode 14*a*, a first interlayer insulating film 15, a second interlayer insulating film 17, and a source electrode 18*a* and a drain electrode 18*b*, which are provided sequentially in this order on the base coat film 11. Here, as illustrated in FIGS. 4 and 5, the semiconductor layer 12*a* is provided in an island shape on the base coat film 11, and includes a channel region, a source region, and a drain region, for example. Further, as illustrated in FIGS. 4 and 5, the gate insulating film 13 is provided so as to cover the semiconductor layer 12*a*. Further, as illustrated in FIGS. 4 and 5, the gate electrode 14*a* is provided on the gate insulating film 13 so as to overlap with the channel region of the semiconductor layer 12*a*. Further, as illustrated in FIGS. 4 and 5, the first interlayer insulating film 15 and the second interlayer insulating film 17 are sequentially provided so as to cover the gate electrode 14*a*. Further, as illustrated in FIGS. 4 and 5, the source electrode 18*a* and the drain electrode 18*b* are provided so as to be separated from each other on the second interlayer insulating film 17. Further, as illustrated in FIGS. 4 and 5, the source electrode 18*a* and the drain electrode 18*b* are electrically connected to the source region and the drain region of the semiconductor layer 12*a*, respectively, via respective contact holes formed in a layered film configured by the gate insulating film 13, the first interlayer insulating film 15, and the second interlayer insulating film 17. Note that the gate insulating film 13, the first interlayer insulating film 15, and the second interlayer insulating film 17 are each constituted by a single-layer film or a layered film of an inorganic insulating film made of, for example, silicon nitride, silicon oxide, or silicon oxynitride.

The second TFT 9*b* is electrically connected to the corresponding first TFT 9*a* and power source line 18*g* in each of the subpixels Pr, Pg, and Pb, as illustrated in FIG. 3. As illustrated in FIGS. 4 and 5, the first TFT 9*b* includes a semiconductor layer 12*b*, a gate insulating film 13, a gate electrode 14*b*, a first interlayer insulating film 15, a second interlayer insulating film 17, and a source electrode 18*c* and a drain electrode 18*d*, provided in that order on the base coat film 11. Here, as illustrated in FIGS. 4 and 5, the semiconductor layer 12*b* is provided in an island shape on the base coat film 11, and includes a channel region, a source region, and a drain region, for example. Further, as illustrated in FIGS. 4 and 5, the gate insulating film 13 is provided so as to cover the semiconductor layer 12*b*. Further, as illustrated in FIGS. 4 and 5, the gate electrode 14*b* is provided on the gate insulating film 13 so as to overlap with the channel region of the semiconductor layer 12*b*. Further, as illustrated in FIGS. 4 and 5, the first interlayer insulating film 15 and the second interlayer insulating film 17 are sequentially provided so as to cover the gate electrode 14*b*. Further, as illustrated in FIGS. 4 and 5, the source electrode 18*c* and the drain electrode 18*d* are provided so as to be separated from each other on the second interlayer insulating film 17. Further, as illustrated in FIGS. 4 and 5, the source electrode 18*c* and the drain electrode 18*d* are electrically connected to the source region and the drain region of the semiconductor layer 12*b*, respectively, via respective contact holes formed in a layered film configured by the gate insulating film 13, the first interlayer insulating film 15, and the second interlayer insulating film 17.

Note that in the present embodiment, the first TFT 9*a* and the second TFT 9*b* are exemplified as being of a top-gate type, but the first TFT 9*a* and the second. TFT 9*b* may be a bottom-gate type TFT.

The capacitor 9*c* is electrically connected to the corresponding first TFT 9*a* and power source line 18*g* in each of the subpixels Pr, Pg, and Pb, as illustrated in FIG. 3. Here, the capacitor 9*c* includes, as illustrated in FIGS. 4 and 5, a lower conductive layer 14*c* provided as the first wiring line layer 14, the first interlayer insulating film 15 provided so as to cover the lower conductive layer 14*c*, and an upper conductive layer 16*c* provided, as the second wiring line layer 16, on the first interlayer insulating film 15 so as to overlap with the lower conductive layer 14*c*. Note that, as illustrated in FIGS. 4 and 5, the upper conductive layer 16*c* is electrically connected to the power source line 18*g* via a contact hole formed in the second interlayer insulating film 17. Further, as illustrated in FIG. 3, the lower conductive layer 14*c* is electrically connected to the drain electrode 18*b* of the first TFT 9*a* and the gate electrode 14*b* of the second TFT 9*b*.

The flattening film 19 has a flat surface in the first display region Da and the second display region Db, and is formed, for example, of an organic resin material such as a polyimide resin.

The organic EL element layer 30 includes, as illustrated in FIGS. 4 and 5, a plurality of first electrodes 21, a common edge cover 22*a*, a plurality of the organic EL layers 23, and a common second electrode 24 provided in that order on the flattening film 19 corresponding to the plurality of subpixels Pr, Pg, and Pb.

As illustrated in FIGS. 4 and 5, the first electrode 21 is electrically connected to the drain electrode 18*d* of the second TFT 9*b* of each subpixel Pr, Pg, and Pb via a contact hole formed in the flattening film 19. In addition, the first electrodes 21 have a function of injecting holes (positive holes) into the organic EL layer 23. In addition, the first electrodes 21 are preferably formed of a material with a high work function to improve the efficiency of hole injection into the organic EL layer 23. Here, examples of a material constituting the first electrodes 21 include metal materials such as silver (Ag), aluminum (Al), vanadium (V), cobalt (Co), nickel (Ni), tungsten (V gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Further, the material constituting the first electrodes 21 may be an alloy of astatine (At)/astatine oxide ($AtO_2$), and the like, for example. Furthermore, a material constituting the first electrodes 21 may be electrically conductive oxide, for example, tin oxide (SnO), zinc oxide (ZnO), indium tin oxide (ITO), or indium zinc oxide (ISO). In addition, the first electrodes 21 may be formed by layering a plurality of layers formed of any of the materials described above. Note that, examples of compound materials having a high work function include indium tin oxide (ITO) and indium zinc oxide (IZO).

As illustrated in FIG. 4, the edge cover 22*a* is provided in the form of a lattice in the entire first display region Da in a manner as to cover a peripheral end portion of each first electrode 21. Examples of a material constituting the edge cover 22*a* include a positive photosensitive resin such as a polyimide resin, acrylic resin, polysiloxane resin, and novolac resin. Also, as illustrated in FIG. 5, the edge cover 22*b* is disposed in the second display region Db in such a manner as to cover peripheral end portions of the first electrodes 21, Here, as illustrated in FIG. 7, the edge cover 22*b* is provided at the boundary of the first display region Da and constitutes a light blocking portion S. Here, examples of a material constituting the edge cover 22*b* include a positive-working photosensitive resin such as a polyimide resin, an acrylic resin, a polysiloxane resin, and a novolac resin. Further, as illustrated in FIG. 5, the edge cover 22*b* is provided as a black colored portion colored black and containing, for example, carbon black C, and its optical density (OD value) is from 0.1 to 1.5. Also, the thickness (for example, approximately 3 μm) of the edge cover 22*b* is greater than the thickness of the edge cover 22*a* (for example, approximately 2 μm). The edge cover 22*b* is provided uninterrupted so as to surround the central portion of the second display region Db and surround all of the pixels P disposed in the second display region Db. Note that, in the present embodiment, an edge cover 22*b* provided in an uninterrupted manner is exemplified, but the edge cover 22*b* may be intermittently provided with interruptions.

Additionally, in the present embodiment, a configuration in which the edge cover 22*b* having a single layer structure is provided in the second display region Db is exemplified, but the edge cover 22*c* may be a two-layer structure as illustrated in FIG. 8. Specifically, in the organic EL display device 50*b* of the modified example, as illustrated in FIG. 8, the edge cover 22*c* includes a black colored portion 22*cb* provided as the light blocking portion S and a transparent layer 22*ca* provided to overlap the black colored portion 22*cb* on the resin substrate layer 10 side of the black colored portion 22*cb*. Here, the transparent layer 22*ca* is made of a positive-working photosensitive resin such as a polyimide resin, an acrylic resin, a polysiloxane resin, and a novolac resin and has a thickness of approximately 2 μm. Also, as illustrated in FIG. 8, the black colored portion 22*cb* is made of a positive-working photosensitive resin, such as a polyimide resin, an acrylic resin, a polysiloxane resin, and a novolac resin, containing carbon black C, has a thickness of approximately 1 μm, and an optical density (OD value) from 0.1 to 1.5.

As illustrated in FIG. 6, the organic EL layer 23, provided as a function layer, includes a hole injection layer 1, a hole transport layer 2, a light-emitting layer 3, an electron transport layer 4, and an electron injection layer 5 that are sequentially layered, on the first electrode 21.

The hole injection layer 1 is also referred to as an anode electrode buffer layer, and has a function of reducing an energy level difference between the first electrodes 21 and the organic EL layers 23 to thereby improve the efficiency of hole injection into the organic EL layers 23 from the first electrodes 21. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives, and the like.

The hole transport layer 2 has a function of improving the efficiency of hole transport from the first electrodes 21 to the organic EL layers 23. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide, and the like.

The light-emitting layer 3 is a region where holes and electrons are injected from the first electrode 21 and the second electrode 24, respectively, and the holes and the electrons recombine, when a voltage is applied via the first electrode 21 and the second electrode 24. Here, the light-emitting layer 3 is formed of a material having high luminous efficiency. Moreover, examples of materials constituting the light-emitting layer 3 include metal oxinoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, tris-styryibenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane, and the like.

The electron transport layer 4 has a function of facilitating migration of electrons to the light-emitting layer 3 efficiently. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxinoid compounds, and the like, as organic compounds.

The electron injection layer 5 has a function of reducing an energy level difference between the second electrode 24 and the organic EL layer 23 to thereby improve the efficiency of electron injection into the organic EL layer 23 from the second electrode 24, and the electron injection layer 5 can lower the drive voltage of the organic EL element by this function. Note that the electron injection layer 5 is also referred to as a cathode buffer layer. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), strontium oxide (SrO), and the like.

As illustrated in FIGS. 4 and 5, the second electrode 24 is disposed to cover the organic EL layer 23 of the subpixels Pr, Pg, and Ph and the edge covers 22*a* and 22*b*. In addition, the second electrode 24 has a function of injecting electrons into the organic EL layer 23. In addition, the second electrode 24 is preferably formed of a material with a low work function to improve the efficiency of electron injection into the organic EL layer 23. Here, examples of materials constituting the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may also be formed of alloys such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), for example. In addition, the second electrode 24 may be formed of electrically conductive oxide, for example, tin oxide (SnO), zinc oxide (ZnO), indium tin oxide (ITO), indium zinc oxide (TSO), or the like. In addition, the second electrode 24 may be formed by layering a plurality of layers formed of any of the materials described above. Note that examples of materials having a low work function include magnesium (Mg), lithium (Li), lithium fluoride (LiF), magnesium (Mg)/copper (Cu), magnesium (Mg)/silver (Ag), sodium (Na)/potassium (K), lithium (Li/aluminum (Al), lithium (Li)/calcium (Ca)/aluminum (Al), lithium fluoride (LiF)/calcium (Ca)/aluminum (Al), and the like.

As illustrated in FIGS. 4 and 5, the sealing film 35 is provided on the organic EL element layer 30 so as to cover the organic EL element layer 30. Here, as illustrated in FIGS. 4 and 5, the sealing film 35 is provided with a first inorganic sealing film 31, an organic sealing film 32, and a second inorganic sealing film 33 layered in this order on the second electrode 24 and has a function to protect the organic EL layers 23 of the organic EL element layer 30 from moisture and oxygen. Here, the first inorganic sealing film 31 and the second inorganic sealing film 33 include, for example, an inorganic insulating film such as a silicon nitride film, a silicon oxide film, and a silicon oxynitride film. Additionally, the organic sealing film 32 includes, for example, an organic resin material such as an acrylic resin, an epoxy resin, a silicone resin, a polyurea resin, a parylene resin, a polyimide resin, and a polyamide resin.

Additionally, as illustrated in FIG. 1, the organic EL display device 50*a* includes, in the frame region F, a first dam wall Wa provided in a frame-like shape outside the trench G and a second dam wall Wb provided in a frame-like shape in a periphery of the first dam wall Wa.

The first dam wall Wa and the second dam wall Wb are each formed by, for example, layering a resin layer formed of the same material and in the same layer as those of the flattening film 19, and a resin layer formed of the same material and in the same layer as those of the edge cover 22*a* to form a layered plurality of resin layers. Note that the first dam wall Wa is provided overlapping a peripheral end portion of the organic sealing film 32 of the sealing film 35, and is configured to suppress the spread of ink corresponding to the organic sealing film 32.

In addition, as illustrated in FIG. 1, the organic EL display device 50*a* includes, in the frame region F, a first frame wiring line 18*h* provided in a frame-like shape as the third wiring line layer 18 inward from the trench G, with both end portions at the portion where the trench G opens extending to the terminal portion T. Here, the first frame wiring line 18 his electrically connected to each power source line 18*g* of the first display region Da, and is configured so that a high power supply voltage (ELVDD) is input at the terminal portion T.

In addition, as illustrated in FIG. 1, the organic EL display device 50*a* includes, in the frame region F, a second frame wiring line 18*i* provided in a substantially C-like shape as the third wiring line layer 18 outward from the trench G, with both end portions extending to the terminal portion T. Here, the second frame wiring line 18*i* is electrically connected to the second electrode 24 via a connection wiring line (not illustrated) provided in the trench G, and is configured so that a low power supply voltage (ELVSS) is input at the terminal portion T.

In the organic EL display device 50*a* described heretofore, in each subpixel Pr, Pg, and Ph, a gate signal is inputted into the first TFT 9*a* via the gate line 14*d* to thereby turn on the first TFT 9*a*, a voltage corresponding to a source signal is written in the gate electrode 14*b* of the second TFT 9*b* and the capacitor 9*c* via the source line 18*f*, and a current from the power source line 18*g* defined based on the gate voltage of the second TFT 9*b* is supplied to the organic EL layer 23, whereby the light-emitting layer 3 of the organic EL layer 23 emits light to display an image. Note that in the organic EL display device 50*a*, even when the first TFT 9*a* is turned off, the gate voltage of the second TFT 9*b* is held by the capacitor 9*c*. Thus, the light emission by the light-emitting layer 3 is maintained until the gate signal of the next frame is input.

Next, a method for manufacturing the organic EL display device 50*a* according to the present embodiment will be described. Note that the manufacturing method for the organic EL display device 50*a* according to the present embodiment includes a TFT layer forming process, an organic EL element layer forming process, and a sealing film forming process.

TFT Layer Forming Step

For example, the TFT layer 20 is formed on the surface of the resin substrate layer 10 formed on the glass substrate by forming the base coat film 11, the first TFT 9*a*, the second TFT 9*b*, the capacitor 9*c*, the flattening film 19, and the like by using a known method.

Organic EL Element Layer Forming Step

The organic EL element layer 30 is formed by forming the first electrode 21, the edge covers 22*a* and 22*b*, the organic EL layer 23 (the hole injection layer 1, the hole transport layer 2, the light-emitting layer 3, the electron transport layer 4, the electron injection layer 5), and the second electrode 24 on the flattening film 19 of the TFT layer 20 having been formed in the TFT layer forming process, by using a known method.

Sealing Film Formation Process

First, an inorganic insulating film such as a silicon nitride film, a silicon oxide film, or a silicon oxynitride film is formed by a plasma CVD method on a substrate surface formed with the organic EL element layer 30 formed in the organic EL element layer forming process by using a mask to form the first inorganic sealing film 31.

Next, on the substrate surface formed with the first inorganic sealing film 31, a film made of an organic resin material such as acrylic resin is formed by, for example, using an ink-jet method to form the organic sealing film 32.

Next, an inorganic insulating film such as a silicon nitride film, a silicon oxide film, or a silicon oxynitride film is formed by a plasma CVD method on the substrate formed with the organic sealing film 32 by using a mask to form the second inorganic sealing film 33, thereby forming the sealing film 35.

Then, a protective sheet (not illustrated) is bonded on the substrate surface on which the sealing film 35 is formed, and subsequently the laser light is irradiated from the glass substrate side of the resin substrate layer 10, so that the glass substrate is peeled off from a lower surface of the resin substrate layer 10, and subsequently, a protective sheet (not illustrated) is bonded on the lower surface of the resin substrate layer 10 from which the glass substrate has been peeled off.

In the above-described manner, the organic EL display device 50*a* of the present embodiment can be manufactured. Note that the image capture unit 40 is installed so that the image capture unit 40 is disposed on the back surface side of the second display region Db when the organic EL display device 50*a* is fixed to the inside of the housing, for example.

As described above, according to the organic EL display device 50*a* of the present embodiment, in the second display region Db in which the image capture unit 40 is installed, the edge cover 22*b* is provided as the light blocking portion S at the boundary with the first display region Da. Accordingly, the leaked light of the display light emitted at the first display region Da is absorbed by the black colored edge cover 22*b*, and thus the incident display light on the image capture unit 40 can be suppressed, and it is possible to minimize or prevent light noise in the image captured by the image capture unit 40.

Furthermore, according to the organic EL display device 50*a* of the present embodiment, when the user's own image is captured, i.e., when capturing a selfie, the position of the second display region Db where the image capture unit 40 is installed can be recognized via the black colored edge cover 22*b* on the display screen, allow for a selfie to be captured with eyes looking in the right direction.

Second Embodiment

Figure 9:
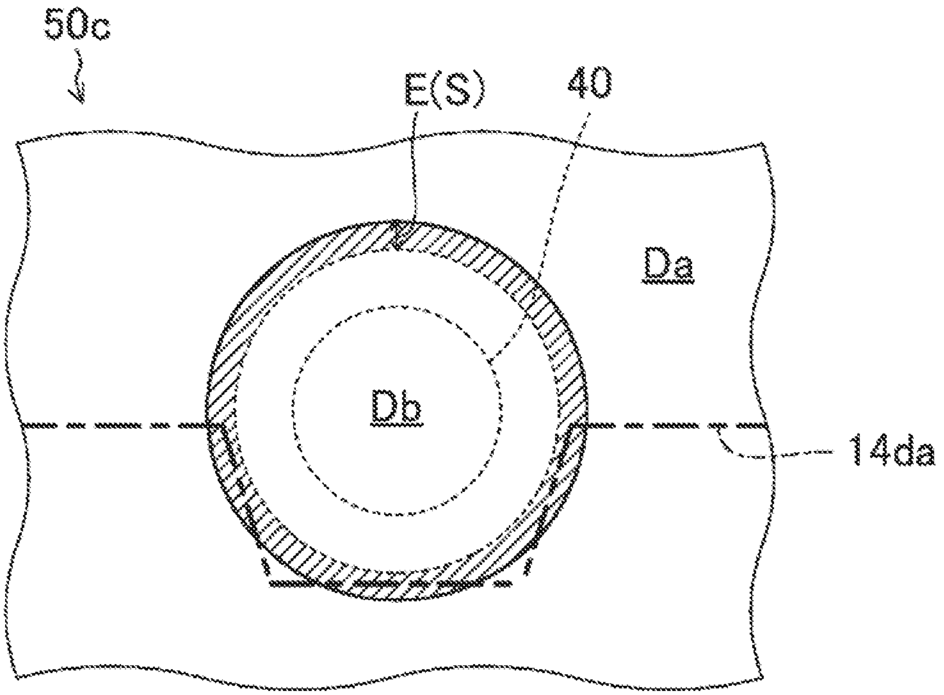
FIG. 9 is a plan view schematically illustrating a second display region of an organic EL display device according to a second embodiment of the disclosure and the periphery of the second display region.
Figure 10:
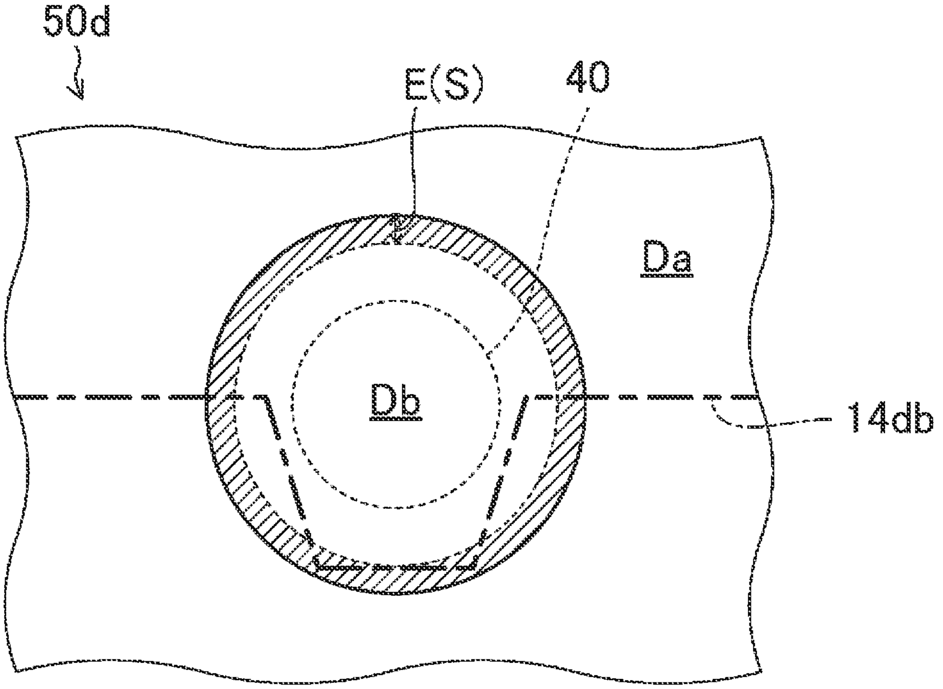
FIG. 10 is a plan view schematically illustrating a second display region according to a modified example of an organic EL display device according to a second embodiment of thedisclosure and the periphery of the second display region.

FIGS. 9 and 10 illustrate a second embodiment of a display device according to thedisclosure. Here, FIG. 9 is a plan view that schematically illustrates the second display region Db and a periphery of the second display region Db of an organic EL display device 50*c* of the present embodiment. Further, FIG. 10 is a plan view that schematically illustrates the second display region Db and a periphery of the second display region Db of an organic EL display device 50*d* of a modified example of the organic EL display device 50*c*. Note that, in each of the following embodiments, the same portions as those in FIG. 1 to FIG. 8 are denoted by the same reference signs, and the detailed description of these portions are omitted.

In the first embodiment, the organic EL display device 50*a* provided with the edge cover 22*b* as the light blocking portion S is exemplified. However, in the present embodiment, the organic EL display device 50*c* provided a conductive layer F as the light blocking portion S is exemplified.

In the organic EL display device 50*c*, as illustrated in FIG. 9, instead of the edge cover 22*b* provided in the organic EL display device 50*a*, the conductive layer E is provided as the light blocking portion S at the boundary with the first display region Da in the second display region Db, and other configurations are substantially the same as the organic EL display device 50*a*. Note that the edge cover disposed in the second display region Db is provided in the same layer and of the same material as the edge cover 22*a* of the first display region Da of the organic EL display device 50*a*.

The conductive layer E is provided as the first wiring line layer 14, the second wiring line layer 16, or the third wiring line layer 18 constituting the TFT layer 20. Note that, although in FIG. 5, the second TFT 9*b* is disposed in a layer below the edge cover 22*b*, the pixel density is relatively low in the second display region Db, and thus the conductive layer E including the first wiring line layer 14, the second wiring line layer 16, or the third wiring line layer 18 in a layer below the edge cover 22*b* can be disposed spaced apart from the first TFT 9*a*, the second TFT 9*b*, and the capacitor 9*c*. Further, as illustrated in FIG. 9, the conductive layer E is provided in an uninterrupted manner in an annular shape so as to surround the central portion of the second display region Db. Note that, in the present embodiment, the conductive layer E provided in an uninterrupted manner is exemplified, but the conductive layer E may be intermittently provided with interruptions. The conductive layer E is provided so as to surround all of the pixels P disposed in the second display region Db. The conductive layer E is electrically connected to the power source line 18*g*. Here, in the second display region Db, the gate line 14*da* is provided so as to bypass the central portion of the second display region Db, as illustrated in FIG. 9. As illustrated in FIG. 9, the conductive layer E is provided so as to overlap with the gate line 14*da* in the second display region Db. Note that, in the present embodiment, the organic EL display device 50*c* provided with the conductive layer E overlapping the gate line 14*da* is exemplified. However, as illustrated in FIG. 10, the organic EL display device 50*d* may be provided with a gate line 14*db* provided also on the inner side of the conductive layer E in the second display region Db.

As described above, according to the organic EL display device 50*c* of the present embodiment, in the second display region Db in which the image capture unit 40 is installed, the conductive layer E is provided as the light blocking portion S at the boundary with the first display region Da. Accordingly, the leaked light of the display light emitted at the first display region Da is absorbed by the conductive layer E, and thus the incident display light on the image capture unit 40 can be suppressed, and it is possible to minimize or prevent light noise in the image captured by the image capture unit 40.

In addition, according to the organic EL display device 50*c* of the present embodiment, the conductive layer E is electrically connected to the power source line 18 g, and thus the electrical resistance of the power source line 18*g* can be reduced.

Also, according to the organic EL display device 50*c* of the present embodiment, in the second display region Db, the conductive layer E is provided so as to overlap the gate line 14*da*, and thus the capacitance of the capacitor 9*c* formed between the conductive layer E provided as the second wiring line layer 16 and electrically connected to the power source line 18*g* and the gate line 14*da* can be increased.

OTHER EMBODIMENTS

In each of the embodiments described above, the organic EL layer having a five-layer structure including the hole injection layer, the hole transport layer, the light-emitting layer, the electron transport layer, and the electron injection layer is exemplified, but the organic EL layer may have a three-layer structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. Thedisclosure is also applicable to an organic EL display device in which the layered structure of the organic EL layer is reversed with the first electrode being a cathode and the second electrode being an anode.

In each of the embodiments described above, the organic EL display device in which the electrode of the TFT connected to the first electrode serves as the drain electrode is exemplified. However, the disclosure is also applicable to an organic EL display device in which the electrode of the TFT connected to the first electrode is referred to as the source electrode.

In addition, in each of the embodiments described above, the organic EL display device is exemplified and described as a display device. The disclosure is also applicable to a display device including a plurality of light-emitting elements that is driven by an electrical current. For example, the disclosure is applicable to a display device including quantum-dot light emitting diodes (QLEDs) that are light-emitting elements using a quantum dot-containing layer.

INDUSTRIAL APPLICABILITY

As described above, the disclosure is useful for a flexible display device.

The invention claimed is:

1. A display device, comprising:

a base substrate;

a thin film transistor layer provided on the base substrate;

a light-emitting element layer provided on the thin film transistor layer, the light-emitting element layer including a plurality of first electrodes, an edge cover, a plurality of function layers, and a second electrode layered, in this stated order, corresponding to a plurality of subpixels forming a first display region and a second display region, wherein the second display region is provided, in a planar view, in a region different from the first display region and is surrounded by the first display region; and a sealing film provided on the light-emitting element layer, wherein:

a light blocking portion is provided in the second display region at a boundary between the first display region and the second display region, the light blocking portion is provided in the edge cover, the edge cover, in the second display region, includes a black colored portion colored black, the plurality of subpixels forming the first display region is arranged at a first pixel pitch to have a first pixel density, the plurality of subpixels forming the second display region is arranged at a second pixel pitch to have a second pixel density, the second pixel density is less than the first pixel density, and in the planar view, at least one of the plurality of subpixels is arranged at a center of the second display region.

2. The display device according to claim 1, wherein the edge cover, in the second display region, further includes a transparent layer provided so as to overlap the black colored portion on a base substrate side of the black colored portion.

3. The display device according to claim 1, wherein a thickness of the black colored portion is greater than a thickness of the edge cover in the first display region.

4. The display device according to claim 1, wherein the black colored portion includes carbon black.

5. The display device according to claim 4, wherein an optical density of the black colored portion is from 0.1 to 1.5.

6. The display device according to claim 1, wherein the light blocking portion is provided uninterrupted so as to surround a central portion of the second display region.

7. The display device according to claim 1, wherein the light blocking portion is provided so as to surround all pixels disposed in the second display region.

8. The display device according to claim 1, wherein each function layer is an organic electroluminescence layer.

9. The display device according to claim 1, further comprising:

an image capture unit provided on an opposite side of the thin film transistor layer of the base substrate in the second display region.

10. The display device according to claim 9, wherein at least one of the plurality of subpixels overlaps with the image capture unit in the planar view.

11. A display device, comprising:

a base substrate;

a thin film transistor layer provided on the base substrate;

a light-emitting element layer provided on the thin film transistor layer, the light-emitting element layer including a plurality of first electrodes, an edge cover, a plurality of function layers, and a second electrode layered, in this stated order, corresponding to a plurality of subpixels forming a first display region and a second display region, wherein the second display region is provided, in a planar view, in a region different from the first display region and is surrounded by the first display region; and a sealing film provided on the light-emitting element layer, wherein:

a light blocking portion is provided in the second display region at a boundary between the first display region and the second display region, the light blocking portion includes a conductive layer which forms the thin film transistor layer, the plurality of subpixels forming the first display region is arranged at a first pixel pitch to have a first pixel density, the plurality of subpixels forming the second display region is arranged at a second pixel pitch to have a second pixel density, the second pixel density is less than the first pixel density, and in the planar view, at least one of the plurality of subpixels is arranged at a center of the second display region.

12. The display device according to claim 11, wherein the thin film transistor layer includes a first wiring line layer, a first interlayer insulating film, a second wiring line layer, a second interlayer insulating film, and a third wiring line layer in this order from a base substrate side, and the conductive layer is provided as the first wiring line layer.

13. The display device according to claim 11, wherein the thin film transistor layer includes a first wiring line layer, a first interlayer insulating film, a second wiring line layer, a second interlayer insulating film, and a third wiring line layer in this order from a base substrate side, and the conductive layer is provided as the second wiring line layer.

14. The display device according to claim 11, wherein the thin film transistor layer includes a first wiring line layer, a first interlayer insulating film, a second wiring line layer, a second interlayer insulating film, and a third wiring line layer in this order from a base substrate side, and the conductive layer is provided as the third wiring line layer.

15. The display device according to claim 13, wherein the thin film transistor layer further includes a power source line provided as the third wiring line layer, the power source line, for each subpixel, is electrically connected to a corresponding first electrode via a thin film transistor, and the conductive layer is electrically connected to the power source line.

16. The display device according to claim 15, wherein the thin film transistor layer further includes a gate line, the first wiring line layer includes the gate line, the gate line is provided so as to bypass a central portion of the second display region, and the conductive layer is provided, in the second display region, so as to overlap the gate line.

17. The display device according to claim 16, wherein the gate line is provided, in the second display region, inward from the conductive layer.

18. The display device according to claim 11, wherein the light blocking portion is provided uninterrupted so as to surround a central portion of the second display region.

19. The display device according to claim 11, wherein the light blocking portion is provided so as to surround all pixels disposed in the second display region.

20. The display device according to claim 11, wherein each function layer is an organic electroluminescence layer.

21. The display device according to claim 11, further comprising:

an image capture unit provided on an opposite side of the thin film transistor layer of the base substrate in the second display region.

22. The display device according to claim 21, wherein at least one of the plurality of subpixels overlaps with the image capture unit in the planar view.

* * * * *